(12) United States Patent
Wang

(10) Patent No.: US 10,073,555 B2
(45) Date of Patent: Sep. 11, 2018

(54) SENSING DEVICE

(71) Applicant: Nuvoton Technology Corporation, Hsinchu (TW)

(72) Inventor: Cheng-Chih Wang, Hsinchu (TW)

(73) Assignee: Nuvoton Technology Corporation, Hsinchu (TW)

( * ) Notice: Subject to any disclaimer, the term of this patent is extended or adjusted under 35 U.S.C. 154(b) by 0 days.

(21) Appl. No.: 14/961,904

(22) Filed: Dec. 8, 2015

(65) Prior Publication Data

US 2016/0085371 A1 Mar. 24, 2016

Related U.S. Application Data

(63) Continuation-in-part of application No. 14/289,667, filed on May 29, 2014.

(30) Foreign Application Priority Data

Sep. 3, 2013 (TW) .............................. 102131728 A
Feb. 2, 2015 (TW) .............................. 104103429 A

(51) Int. Cl.
G06F 3/044 (2006.01)
G06F 3/041 (2006.01)
H03K 17/96 (2006.01)

(52) U.S. Cl.
CPC ....... *G06F 3/0416* (2013.01); *H03K 17/9622* (2013.01); *G06F 3/044* (2013.01);
(Continued)

(58) Field of Classification Search
CPC .... G06F 3/044; H03K 17/962; H03K 17/955; G01D 5/24
See application file for complete search history.

(56) References Cited

U.S. PATENT DOCUMENTS 8,441,462 B2 5/2013 Kobayashi et al.
2007/0268272 A1* 11/2007 Perski ..................... G06F 3/044
345/173

(Continued)

FOREIGN PATENT DOCUMENTS

CN 101908876 A 12/2010
TW 201118386 A 6/2011
(Continued)

*Primary Examiner* — Carolyn R Edwards
*Assistant Examiner* — Jeffrey A Parker
(74) *Attorney, Agent, or Firm* — CKC Partners Co., Ltd.

(57) ABSTRACT

A sensing device includes a comparator, a first and a second variable capacitor units. The first and second variable capacitor units charge a first and a second comparator inputs, respectively, according to a first and a second driving signals, such that the first and second comparator inputs have a first and a second voltages, respectively, in which a voltage level of the first driving signal is higher than a voltage level of the second driving signal. The comparator is configured to compare the first voltage and the second voltage to generate a comparator output signal. The first variable capacitor unit is adjusted according to the comparator output signal to perform potential compensation for the first comparator input, or the second variable capacitor unit is adjusted according to the comparator output signal to perform potential compensation for the second comparator input.

15 Claims, 7 Drawing Sheets

(52) U.S. Cl.
CPC .............. *H03K 2217/94026* (2013.01); *H03K 2217/960715* (2013.01)

(56) References Cited

U.S. PATENT DOCUMENTS

| | | | | |
|---|---|---|---|---|
| 2009/0009195 A1* | 1/2009 | Seguine | ................... | G01D 5/24 324/690 |
| 2011/0122089 A1 | 5/2011 | Kobayashi et al. | | |
| 2014/0049510 A1* | 2/2014 | Chung | ................... | G06F 3/0416 345/174 |
| 2015/0062074 A1 | 3/2015 | Wang et al. | | |

FOREIGN PATENT DOCUMENTS

| | | | |
|---|---|---|---|
| TW | 201141301 | A | 11/2011 |
| TW | 201329829 | A | 7/2013 |
| WO | 2009090534 | A2 | 7/2009 |
| WO | 2013069290 | A1 | 5/2013 |

\* cited by examiner

SENSING DEVICE

RELATED APPLICATIONS

This application is a continuation-in-part of U.S. application Ser. No. 14/289,667, filed May 29, 2014, which claims priority to Taiwanese Patent Application Serial Number 102131728, filed Sep. 3, 2013, and this application also claims priority to Taiwanese Patent Application Serial Number 104103429, filed Feb. 2, 2015, the disclosure of which is hereby incorporated by reference herein in its entirety.

BACKGROUND

Technical Field

The present disclosure relates to a sensing device. More particularly, the present disclosure relates to a sensing device for sensing operations of touch pads.

Description of Related Art

For high technology nowadays, user interfaces of more and more electronic products have already employed touch panels, such that demands for touch sensing devices have increasingly matured. Touch sensing devices have already become the basis of any kind of user interface, and replacing traditional keyboard interface with touch sensing interface undoubtedly makes the user interface become more intuitional and easier for use.

Moreover, one of ordinary skill in the art can use the touch sensing interface to substitute mechanical keys required in various applications such as access control, mobile phone, MP3 player, personal computer peripherals, remote controller, etc., and costs for manufacturing products can thus be saved.

However, for example, in a capacitive touch sensing device, it usually requires a lot of capacitors for the touch sensing operation, and circuit layout areas occupied by the capacitors are quite large, such that the size of the touch sensing device cannot be reduced effectively and the cost for manufacturing the touch sensing device is kept high.

SUMMARY

An embodiment of the present disclosure is related to a sensing device, which includes a comparator, a first variable capacitor unit, and a second variable capacitor unit. The comparator includes a first comparator input and a second comparator input, and the first comparator input is configured to be electrically coupled to at least one first touch pad. The first variable capacitor unit is electrically coupled to the first comparator input, and the first variable capacitor unit is configured to receive a first driving signal and charge the first comparator input according to the first driving signal, such that the first comparator input has a first potential. The second variable capacitor unit is electrically coupled to the second comparator input, and the second variable capacitor unit is configured to receive a second driving signal and charge the second comparator input according to the second driving signal, such that the second comparator input has a second potential. A voltage level of the first driving signal is higher than a voltage level of the second driving signal, and the comparator is configured to compare the first potential with the second potential to generate a comparator output signal. In a condition of the at least one first touch pad being operated, the first variable capacitor unit is adjusted according to the comparator output signal to perform potential compensation for the first comparator input, or the second variable capacitor unit is adjusted according to the comparator output signal to perform potential compensation for the second comparator input.

Another embodiment of the present disclosure is related to a sensing device, which includes a comparator, a first variable capacitor unit, a second variable capacitor unit, and a first switch. The comparator includes a first comparator input and a second comparator input, and the first comparator input is electrically coupled to at least one first touch pad. The first variable capacitor unit is electrically coupled to the first comparator input and configured to charge the first comparator input with a first driving signal, such that the first comparator input has a first potential. The second variable capacitor unit is electrically coupled to the second comparator input and configured to charge the second comparator input with a second driving signal, such that the second comparator input has a second potential. The comparator is configured to compare the first potential with the second potential to generate a comparator output signal. The first switch is configured to be electrically coupled between the second comparator input and an external capacitor and configured to selectively conduct the second comparator input and the external capacitor. In a condition of the at least one first touch pad being operated, the first variable capacitor unit is adjusted according to the comparator output signal to perform potential compensation for the first comparator input, or the second variable capacitor unit is adjusted according to the comparator output signal to perform potential compensation for the second comparator input.

It is to be understood that both the foregoing general description and the following detailed description are by examples, and are intended to provide further explanation of the disclosure as claimed.

BRIEF DESCRIPTION OF THE DRAWINGS

The disclosure can be more fully understood by reading the following detailed description of various embodiments, with reference to the accompanying drawings as follows.

DETAILED DESCRIPTION

Figure 1:
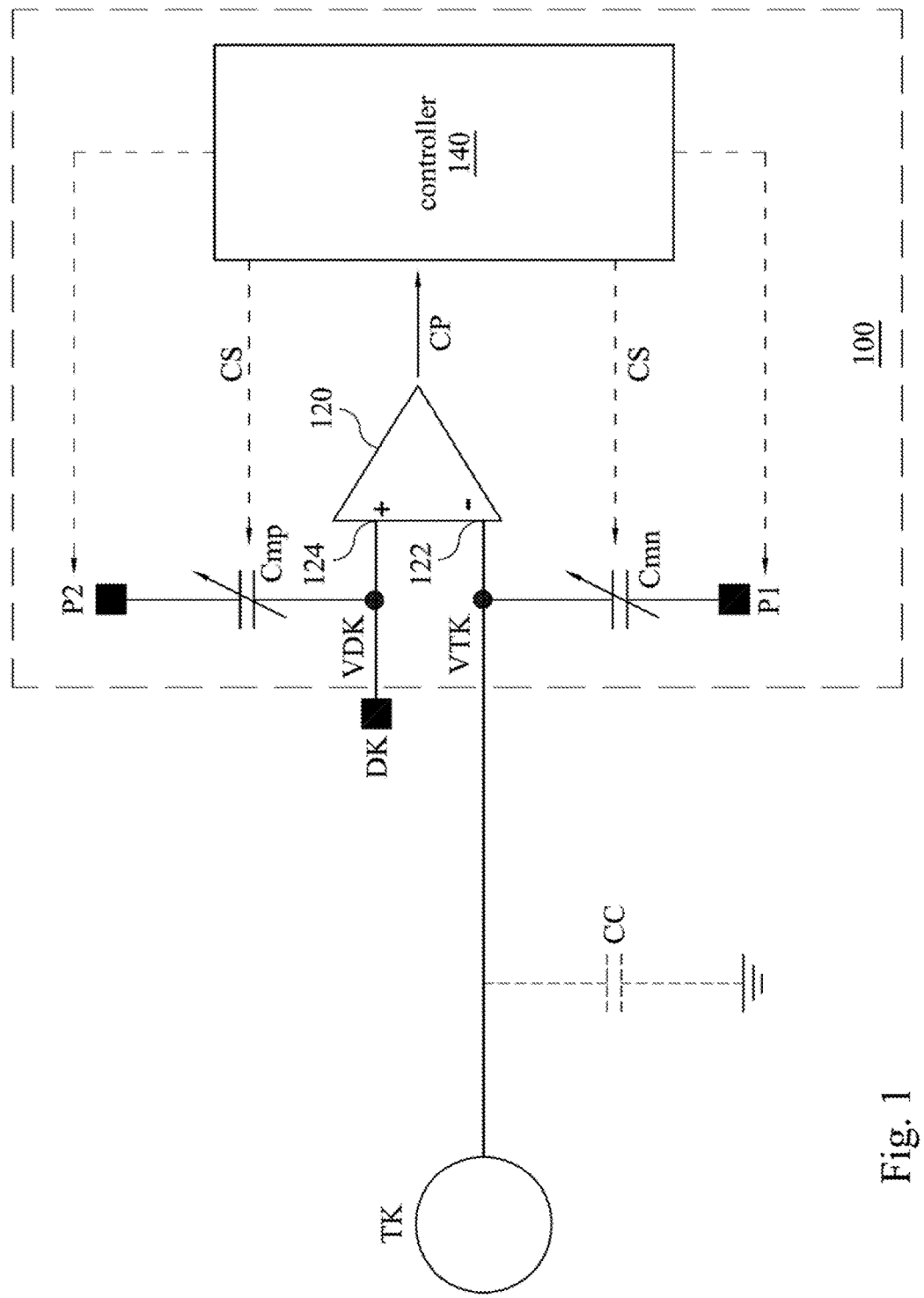
FIG. 1 is a schematic diagram of a sensing device according to a first embodiment of the present disclosure.

In the following description, specific details are presented to provide a thorough understanding of the embodiments of the present disclosure. Persons of ordinary skill in the art will recognize, however, that the present disclosure can be practiced without one or more of the specific details, or in combination with other components. Well-known implementations or operations are not shown or described in detail to avoid obscuring aspects of various embodiments of the present disclosure.

The terms used in this specification generally have their ordinary meanings in the art and in the specific context where each term is used. The use of examples in this specification, including examples of any terms discussed herein, is illustrative only, and in no way limits the scope and meaning of the disclosure or of any exemplified term. Likewise, the present disclosure is not limited to various embodiments given in this specification.

As used herein, "around", "about", "approximately" or "substantially" shall generally refer to any approximate value of a given value or range, in which it is varied depending on various arts in which it pertains, and the scope of which should be accorded with the broadest interpretation understood by the person skilled in the art to which it pertains, so as to encompass all such modifications and similar structures. In some embodiments, it shall generally mean within 20 percent, preferably within 10 percent, and more preferably within 5 percent of a given value or range. Numerical quantities given herein are approximate, meaning that the term "around", "about", "approximately" or "substantially" can be inferred if not expressly stated, or meaning other approximate values.

It will be understood that in the present disclosure, although the terms "first," "second," etc., may be used herein to describe various elements, these elements should not be limited by these terms. These terms are used to distinguish one element from another. For example, a first element could be termed a second element, and, similarly, a second element could be termed a first element, without departing from the scope of the embodiments. As used herein, the term "and/or" includes any and all combinations of one or more of the associated listed items.

As used herein, the terms "comprising," "including," "having," "containing," "involving," and the like are to be understood to be open-ended, i.e., to mean including but not limited to.

Reference throughout the specification to "one embodiment" or "an embodiment" means that a particular feature, structure, implementation, or characteristic described in connection with the embodiment is included in at least one embodiment of the present disclosure. Thus, uses of the phrases "in one embodiment" or "in an embodiment" in various places throughout the specification are not necessarily all referring to the same embodiment. Furthermore, the particular features, structures, implementation, or characteristics may be combined in any suitable manner in one or more embodiments.

In the following description and claims, the terms "coupled" and "connected", along with their derivatives, may be used. In particular embodiments, "connected" and "coupled" may be used to indicate that two or more elements are in direct physical or electrical contact with each other, or may also mean that two or more elements may be in indirect contact with each other. "Coupled" and "connected" may still be used to indicate that two or more elements cooperate or interact with each other.

As illustrated in FIG. 1, the sensing device 100 can be configured to sense operations of at least one touch pad (e.g., a capacitive touch pad TK) and to correspondingly operate (e.g., control sequential circuits, output digital data signals, etc.) according to the sensing result, so as to perform corresponding functions or operations.

The sensing device 100 includes a comparator 120, a variable capacitor unit Cmn and a variable capacitor unit Cmp. The comparator 120 includes a first comparator input 122 and a second comparator input 124, and the first comparator input 122 can be configured to be electrically coupled to the capacitive touch pad TKN. The variable capacitor unit Cmn is electrically coupled to the first comparator input 122 and is configured to receive a driving signal P1, to charge the first comparator input 122 according to the driving signal P1 such that the first comparator input 122 has a first potential VTK. The variable capacitor unit Cmp is electrically coupled to the second comparator input 124 and is configured to receive a driving signal P2, to charge the second comparator input 124 according to the driving signal P2, such that the second comparator input 124 has a second potential VDK. The comparator 120 can be configured to compare the potential VTK with the potential VDK to generate a comparator output signal CP.

In a condition of the capacitive touch pad TK being operated (e.g., the capacitive touch pad TK is touched by a finger, a touch pen, etc., to have capacitance variations), the capacitive touch pad TK can have the potential VTK, and the potential VTK is lower than the potential VDK. The variable capacitor unit Cmn is adjusted according to the comparator output signal CP generated by comparing the first potential VTK with the second potential VDK, to perform potential compensation for the first comparator input 122, such that the potential VTK, after the potential compensation, is equal to or balanced with the potential VDK. Accordingly, potential or capacitance variations corresponding to the operations of the capacitive touch pad TK can be acquired, for sequential data processing, in order to determine if a touch operation occurs or a corresponding touch function is performed.

Similarly, the variable capacitor unit Cmp also can be adjusted according to the comparator output signal CP generated by comparing the first potential VTK with the second potential VDK, to perform potential compensation for the second comparator input 124, such that the potential VDK, after the potential compensation, is equal to or balanced with the potential VTK. The aforementioned operation of performing potential compensation for the first comparator input 122 or performing potential compensation for the second comparator input 124 also can be performed synchronously according to practical needs.

In some embodiments, the voltage level of the driving signal P1 can be approximately multiple times the voltage level of the driving signal P2. In practice, the voltage levels of the driving signals P1 and P2 can be configured within a range of approximately 1-40 volts (V). In some other embodiments, at least one of the driving signals P1 and P2 is a pulse signal. In specific embodiments, the driving signals P1 and P2 both can be pulse signals.

In practice, the voltage levels of the driving signals P1 and P2 can be adjusted by a programmable device or an amplifying device, such that the variable capacitor unit Cmn (and/or Cmp) can correspondingly perform potential compensation for the first comparator input 122 (and/or the second comparator input 124) according to the driving signal P1 (and/or P2) having an amplified level. Alternatively, the capacitance required by the variable capacitor units Cmn (and/or Cmp) can be decreased by increasing values of the driving signal P1 (and/or P2) (e.g., taking Q=CV for example, in a condition that the charge or potential is constant, when the voltage increases, the capacitance decreases correspondingly).

In some embodiments, the first comparator input 122 is a positive input (i.e., the input terminal "+") of the comparator 120, and the second comparator input 124 is a negative input (i.e., the input terminal "−") of the comparator 120. In some other embodiments, the first comparator input 122 is the negative input (i.e., the input terminal "−") of the comparator 120, and the second comparator input 124 is the positive input (i.e., the input terminal "+") of the comparator 120.

Figure 2C:
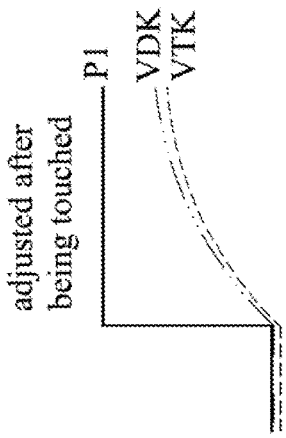
FIGS. 2A-2C are schematic diagrams of capacitance and potential variations in the sensing device shown in FIG. 1, according to one embodiment of the present disclosure.
Figure 2B:
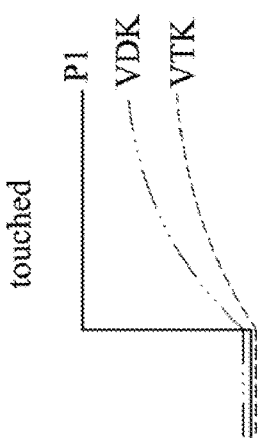
Figure 2A:
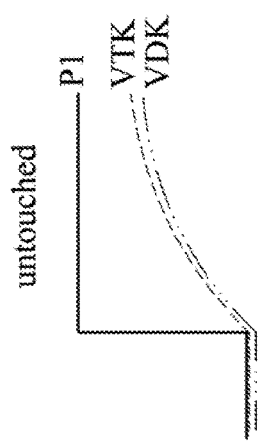

FIGS. 2A-2C are schematic diagrams of capacitance and potential variations in the sensing device shown in FIG. 1, according to one embodiment of the present disclosure. Specifically, as illustrated in FIG. 1 and FIGS. 2A-2C, for example that the variable capacitor units Cmn and Cmp have the same predetermined equivalent capacitance, in the condition of the capacitive touch pad TK being not operated (e.g., the capacitive touch pad TK is not touched), the potential VTK and the potential VDK can be charged through the variable capacitor units Cmn and Cmp, respectively, to be identical or close to each other. Then, in the condition of the capacitive touch pad TK being operated (e.g., the capacitive touch pad TK is touched by a finger, a touch pen, etc.), the capacitance (e.g., a self capacitance CC) of the terminal where the capacitive touch pad TK is coupled to the first comparator input 122 has a variation, such that the potential VTK is decreased to be lower than the potential VDK (as shown in FIG. 2B). Moreover, the variable capacitor unit Cmn can be adjusted according to the comparator output signal CP generated by comparing the potential VTK with the potential VDK (e.g., the variable capacitor unit Cmn may have an equivalent capacitance larger than that of the variable capacitor unit Cmp after the variable capacitor unit Cmn is adjusted), to perform potential compensation for the first comparator input 122, such that the potential VTK is increased again to be identical or close to the potential VDK (as shown in FIG. 2C). The corresponding potential or capacitance variation mentioned above can be provided for the following data processing, to determine if a touch operation occurs, or to perform a corresponding touch function accordingly.

In other embodiments, the variable capacitor unit Cmp can be adjusted according to the comparator output signal CP generated by comparing the potential VTK with the potential VDK (e.g., the variable capacitor unit Cmp may have an equivalent capacitance smaller than that of the variable capacitor unit Cmn after the variable capacitor unit Cmp is adjusted), to perform potential compensation for the second comparator input 124, such that the potential VDK is decreased to be identical or close to the potential VTK. In various embodiments, the variable capacitor units Cmp and Cmn can be respectively adjusted according to the comparator output signal CP generated by comparing the potential VTK with the potential VDK, to perform potential compensation for the first comparator input 122 and the second comparator input 124, such that the potential VDK and the potential VTK are identical or close to each other after the potential compensation.

Furthermore, in the condition that it is unable to perform potential compensation for the first comparator input 122 by the variable capacitor unit Cmn, the driving signal P1 can be further configured to have a higher voltage level (e.g., a voltage level higher than the voltage level of the driving signal P2), such that the variable capacitor unit Cmn can further perform more effective potential compensation for the first comparator input 122 with the driving signal P1, in order for the following touch sensing operation.

The aforementioned operations of adjusting the variable capacitor units Cmp and Cmn according to the comparator output signal CP can be performed at the same time. Alternatively, one (e.g., the variable capacitor unit Cmp) is adjusted and the other (e.g., the variable capacitor unit Cmn) is then adjusted. Alternatively, opposite operations are performed in which the variable capacitor unit Cmn is adjusted and the variable capacitor unit Cmp is then adjusted.

In some embodiments of the present disclosure, "potential compensation" indicates increasing the potential of the comparator input, and also indicates decreasing the potential of the comparator input; in other words, the potential of the comparator input can be compensated to increase or decrease.

In some embodiments, as illustrated in FIG. 1, the sensing device 100 can further include a controller 140. The controller 140 is electrically coupled to the comparator 120, and can be configured to receive the comparator output signal CP to generate the driving signals P1 and P2 transmitted to the variable capacitor units Cmn and Cmp, respectively.

Moreover, the controller 140 also can be configured to receive the comparator output signal CP to generate a control signal CS for controlling the variable capacitor unit Cmn, to adjust the equivalent capacitance of the variable capacitor unit Cmn, such that the variable capacitor unit Cmn can correspondingly perform potential compensation for the first comparator input 122. In various embodiments, the control signal CS also can be configured to adjust the equivalent capacitance of the variable capacitor unit Cmp, such that the variable capacitor unit Cmp can correspondingly perform potential compensation for the second comparator input 124. Alternatively, as described above, the control signal CS also can be configured to adjust the equivalent capacitances of the variable capacitor units Cmp and Cmn, respectively, such that the variable capacitor units Cmp and Cmn can correspondingly perform potential compensation for the second comparator input 124 and the first comparator input 122.

Figure 3:
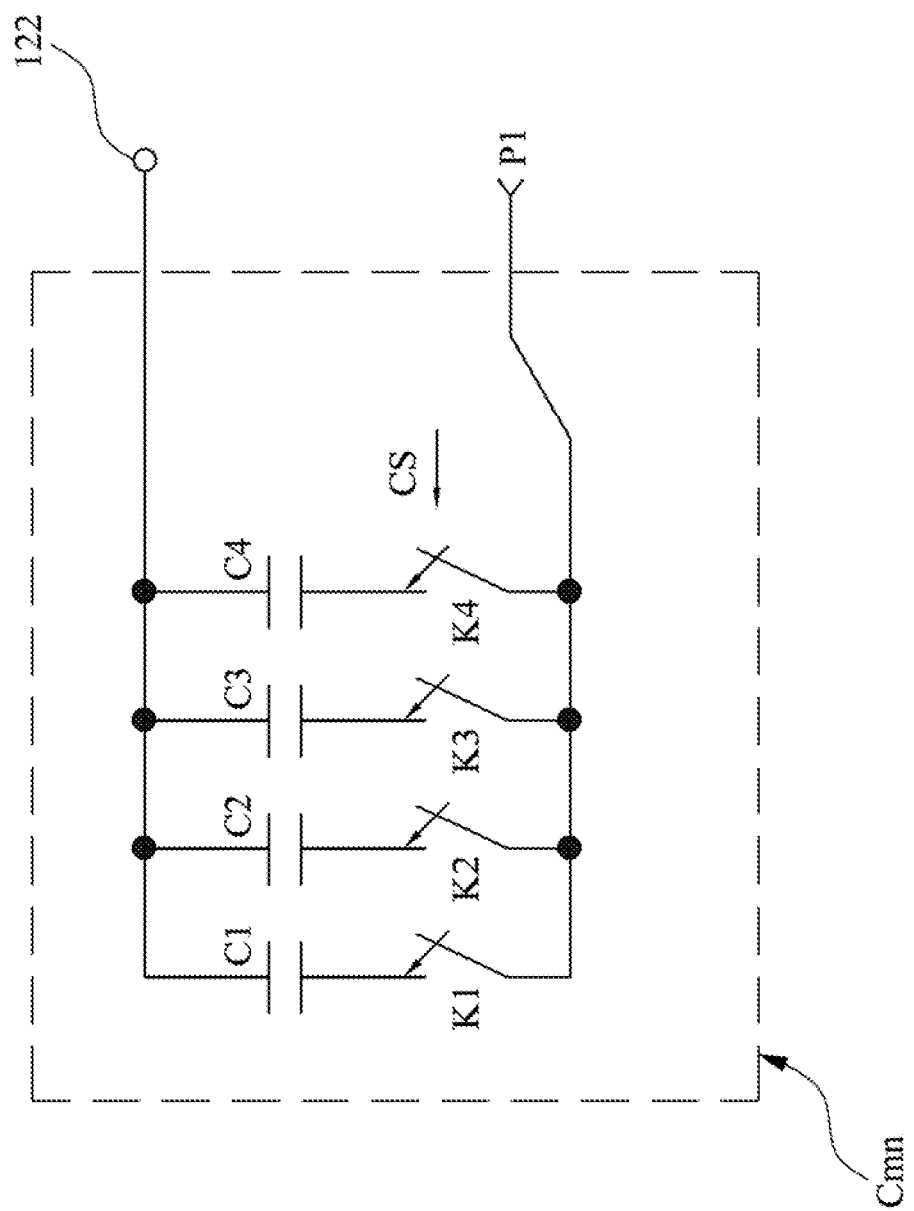
FIG. 3 is a schematic diagram of the variable capacitor unit Cmn as illustrated in FIG. 1, according to one embodiment of the present disclosure.

FIG. 3 is a schematic diagram of the variable capacitor unit Cmn as illustrated in FIG. 1, according to one embodiment of the present disclosure. As illustrated in FIG. 1 and FIG. 3, the variable capacitor unit Cmn includes a plurality of switchable capacitors (e.g., switchable capacitors C1, C2, C3 and C4), and the switchable capacitors C1, C2, C3 and C4 are coupled in parallel with each other, in which one terminals of the switchable capacitors C1, C2, C3 and C4 are configured to selectively receive the driving signal P1, and the other terminals of the switchable capacitors C1, C2, C3 and C4 are coupled to the first comparator input 122.

In some embodiments, when the controller 140 outputs the control signal CS to the variable capacitor unit Cmn, switches K1, K2, K3 and K4 corresponding to the switchable capacitors C1, C2, C3 and C4, respectively, can be separately switched on or off according to the control signal CS, such that the switchable capacitors C1, C2, C3 and C4 are separately activated or deactivated, and the equivalent capacitance of the variable capacitor unit Cmn can be correspondingly adjusted according to the control signal CS.

For the aforementioned embodiments, applying the sensing device 100 in the touch sensing device can achieve very sensitive touch sensing operations with limited circuits (e.g., only one pin connected to the capacitive touch pad TK is required) and limited capacitors, to save related circuits and capacitors and further reduce layout areas occupied by the circuits and capacitors, such that the size of the touch sensing device can be significantly reduced and manufacturing cost can be significantly decreased.

Moreover, in the condition that stray capacitance or self capacitance at the capacitive touch pad TK is relatively larger and the equivalent capacitance of the variable capacitor unit Cmn is relatively smaller, potential compensation cannot be effectively performed by only the variable capacitor unit Cmn. As a result, the following touch sensing operation cannot be performed well. In such condition, the driving signal P1 can be configured to have a higher voltage level, such that the variable capacitor unit Cmn can further provide larger compensating potential according to the driving signal P1, in order to perform more effective potential compensation.

Figure 4:
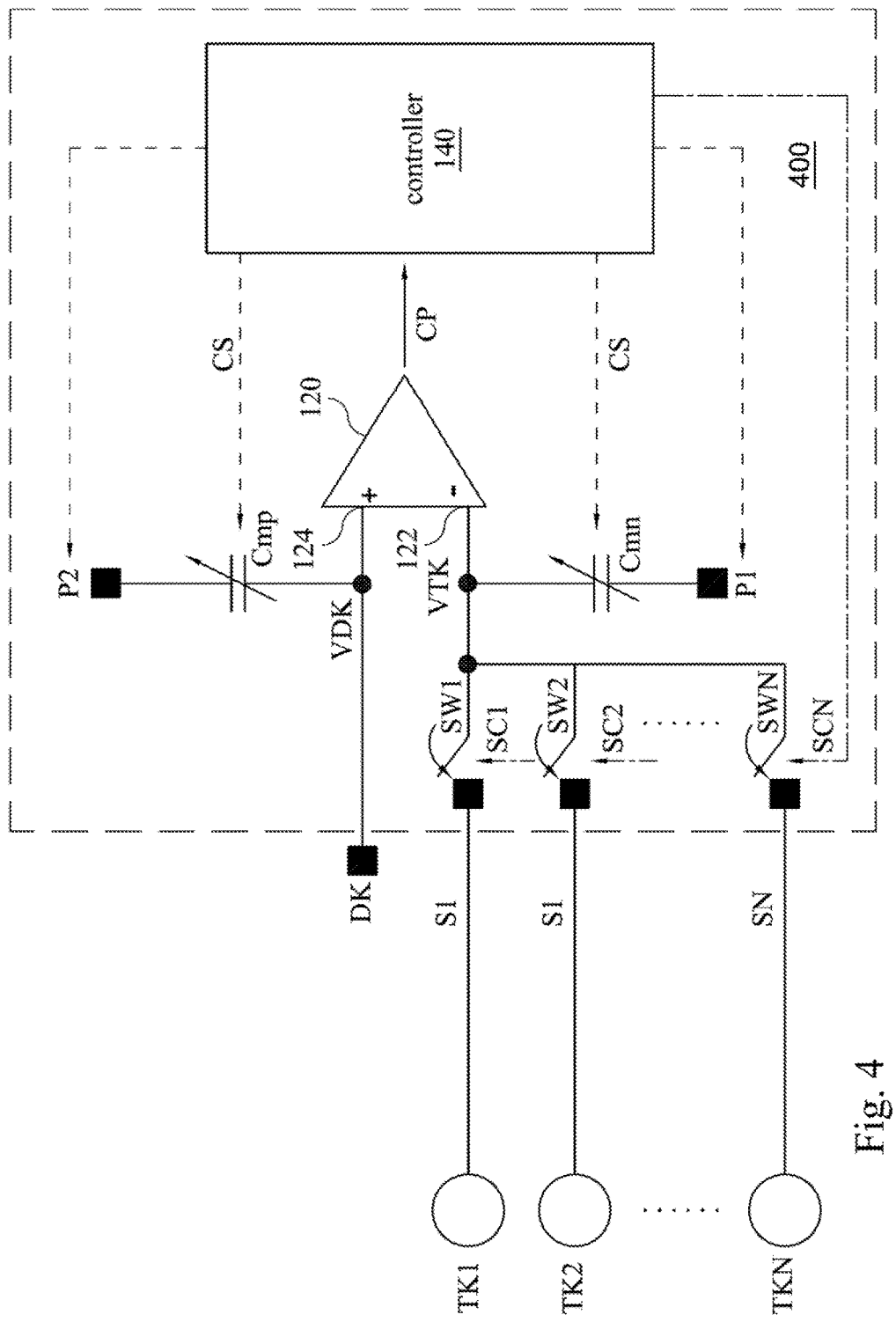
FIG. 4 is a schematic diagram of a sensing device according to a second embodiment of the present disclosure.

FIG. 4 is a schematic diagram of a sensing device according to a second embodiment of the present disclosure. The sensing device 400 illustrated in FIG. 4 can be configured to sense several touch pads, in which the first comparator input 122 can be configured to be electrically coupled to touch pads TK1-TKN. In the present embodiment, the sensing device 400 further can include switches SW1-SWN, in which the switches SW1-SWN are electrically coupled between the first comparator input 122 and the touch pads TK1-TKN, respectively, and can be configured to selectively conduct the first comparator input 122 and the touch pads TK1-TKN, respectively.

In operation, in one embodiment, when the switches SW1-SWN are all conducted, the self capacitance at the touch pads TK1-TKN may affect the potential VTK of the first comparator input 122 at the same time. At the moment, if the equivalent capacitance of the variable capacitor unit Cmn is not sufficient for performing effective potential compensation, the driving signal P1 having relatively high voltage level can be transmitted to the variable capacitor unit Cmn, such that the variable capacitor unit Cmn is able to effectively perform potential compensation for the first comparator input 122 according to the driving signal P1.

Moreover, the controller 140 further can be configured to output switch control signals SC1-SCN for controlling the switches SW1-SWN, respectively. In some embodiments, the controller 140 can be configured to output the switch control signals SC1-SCN for controlling the switches SW1-SWN to be all conducted, such that the sensing device 400 can sense operations of the aforementioned touch pads, so as to perform corresponding functions or operations. For example, any one of the touch pads TK1-TKN can be touched for the corresponding operation, for user to operate according to practical needs.

Figure 5:
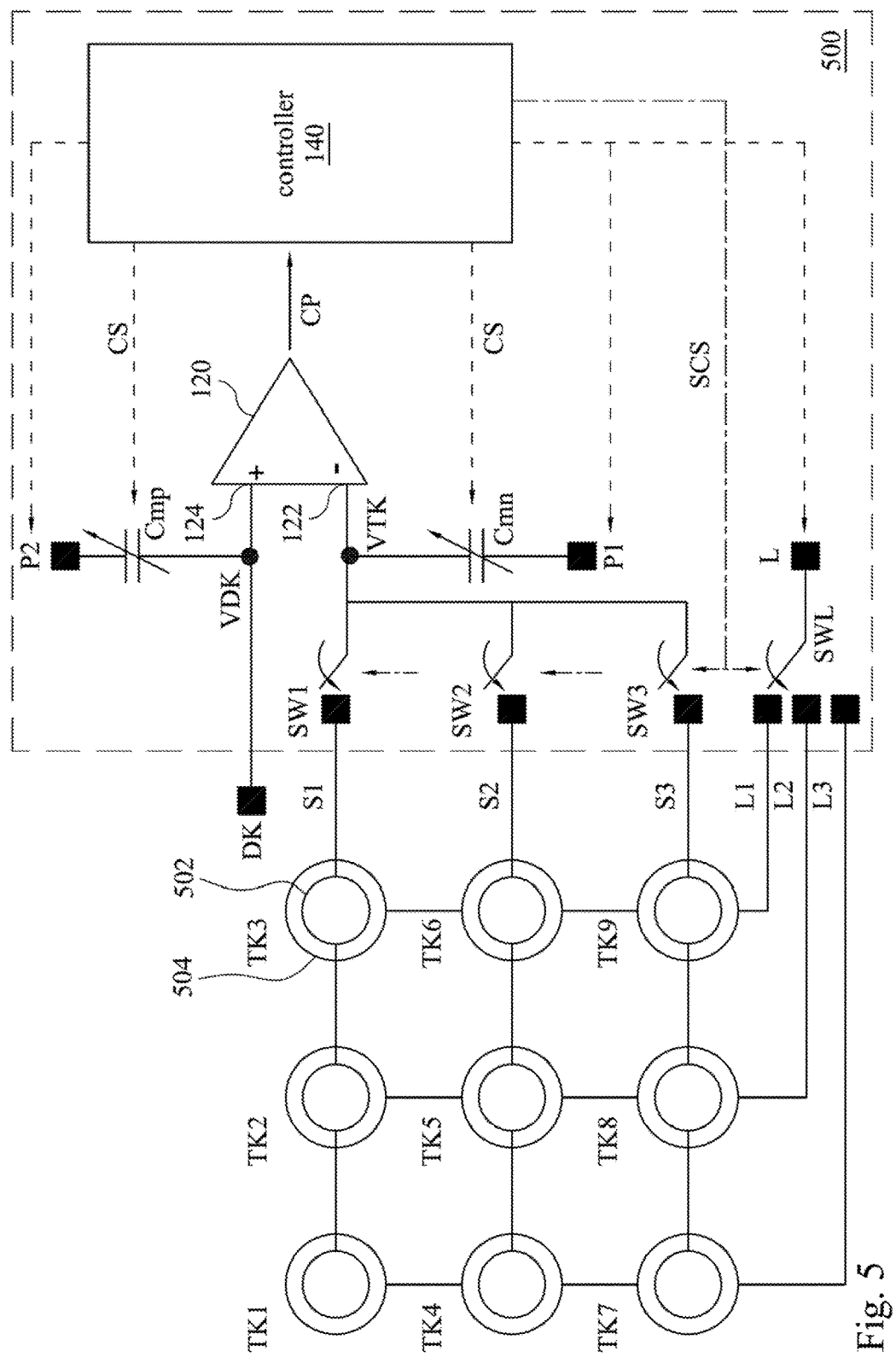
FIG. 5 is a schematic diagram of a sensing device according to a third embodiment of the present disclosure.

FIG. 5 is a schematic diagram of a sensing device according to a third embodiment of the present disclosure. The sensing device 500 can be configured to be electrically coupled to a plurality of series of touch pads (e.g., a first series of touch pads TK1, TK2 and TK3, a second series of touch pads TK4, TK5 and TK6, a third series of touch pads TK7, TK8 and TK9), and configured to sense operations of the touch pads TK1-TK9, so as to perform corresponding functions or operations.

Taking the embodiment illustrated in FIG. 5 for example, the sensing device 500 can include pins S1-S3 and L1-L3. The first series of touch pads TK1, TK2 and TK3 can be electrically coupled to the pin S1, the second series of touch pads TK4, TK5 and TK6 can be electrically coupled to the pin S2, and the third series of touch pads TK7, TK8 and TK9 can be electrically coupled to the pin S3. Moreover, the touch pads TK3, TK6 and TK9 can be configured to receive signals from the pin L1, the touch pads TK2, TK5 and TK8 can be configured to receive signals from the pin L2, and the touch pads TK1, TK4 and TK7 can be configured to receive signals from the pin L3.

In some embodiments, each one of the touch pads TK1-TK9 can include two electrodes, and the two electrodes are electrically coupled to one of the pins S1-S3 and one of the pins L1-L3, respectively. Taking the touch pad TK3 for example, the touch pad TK3 can include electrodes 502 and 504, in which the electrode 502 is electrically coupled to the pin S1, and the electrode 504 is electrically coupled to the pin L1. Furthermore, the electrode (e.g., the electrode 502) coupled to one pin (e.g., the pin S1) is not coupled to or overlapped with the other electrode (e.g., the electrode 504) coupled to the other pin; in other words, the electrodes coupled to two pins are independent from each other.

In practice, the electrodes 502 and 504 can be fabricated in a same layer or different layers, and at least one dielectric layer can be disposed between the electrodes 502 and 504, such that the electrodes 502 and 504 may operate separately. Moreover, although sizes of the electrodes 502 and 504 shown in FIG. 5 are different, they are given for illustrative purposes but not limiting of the present disclosure. The aforementioned dielectric layer can be made of dielectric material or air, such that the electrodes 502 and 504 form a capacitor having a capacitance.

For example, if each touch pad is formed by a layer of upper electrode and a layer of bottom electrode, the upper electrodes of the first series of touch pads TK1, TK2 and TK3 can be electrically coupled to the pin S1, the upper electrodes of the second series of touch pads TK4, TK5 and TK6 can be electrically coupled to the pin S2, and the upper electrodes of the third series of touch pads TK7, TK8 and TK9 can be electrically coupled to the pin S3. The bottom electrodes of the touch pads TK3, TK6 and TK9 can be electrically coupled to the pin L1 and receive signals from the pin L1. The bottom electrodes of the touch pads TK2, TK5 and TK8 can be electrically coupled to the pin L2 and receive signals from the pin L2. The bottom electrodes of the touch pads TK1, TK4 and TK7 can be electrically coupled to the pin L3 and receive signals from the pin L3.

If two electrodes of the touch pad are fabricated in a same layer (e.g., an inner ring is a first electrode, an outer ring is a second electrode, and a dielectric layer is disposed between the first electrode and the second electrode), for example, the first electrodes of the touch pads TK1, TK2 and TK3 can be electrically coupled to the pin S1 (the other series of touch pads can be electrically coupled to the pins S2 and S3, respectively), and configured in a way similar to, for example, crossing over the outer loop electrode (e.g., second electrode) when conductive lines are coupled, to avoid causing short circuit. Similarly, the second electrodes (e.g., the outer loop electrodes) of the touch pads TK3, TK6 and TK9 can be electrically coupled to the pin L1 and receive signals from the pin L1 (in which the second electrodes of the other series of touch pads can be electrically coupled to the pins L2 and L3, respectively).

The sensing device 500 can further include switches SW1-SW3 and a switch unit SWL. The switches SW1-SW3 are coupled to the pins S1, S2 and S3, respectively, and can be configured to selectively conduct the first comparator input 122 and the first, second, and third series of touch pads, respectively, such that the first comparator input 122 can be coupled to at least one corresponding series of touch pads. Moreover, the switch unit SWL can be coupled between the controller 140 and the pins L1, L2 and/or L3, such that the driving signal L can be transmitted through the switch unit SWL to at least one touch pad of each series of touch pads in several series of touch pads. In practice, a level of the driving signal L can be similar to the level of the driving signal P1 illustrated in FIGS. 2A-2C.

In some embodiments, the switch unit SWL can include a number of switches, and these switches are coupled to the pins L1, L2 and L3, respectively, such that the driving signal L can be transmitted through these switches to at least one touch pad of a corresponding series of touch pads in the several series of touch pads via the pins L1, L2 and L3, respectively.

In various embodiments, the switch unit SWL can be a single switch, and the single switch can be switched to be coupled to the pin L1, L2 or L3, such that the driving signal L can be transmitted through the single switch to the corresponding touch pads via the pin L1, L2 or L3.

In operation, for example, when the switch unit SWL is a single switch, in the condition that the switch SW1 conducts the first comparator input 122 and the pin S1 and the switch unit SWL conducts the pin L1, the touch pad TK3 receives the driving signal L through the switch unit SWL. At the moment, if the touch pad TK3 is accordingly operated (e.g., the touch pad TK3 is touched by a finger, a touch pen, etc., to have capacitance variations), the corresponding operations between the touch pad TK3 and the sensing device 500 are similar to the corresponding operations between the touch pad TK and the sensing device 100 in FIG. 1 (e.g., the capacitance and potential variations in the sensing device 100 as illustrated in FIGS. 2A-2C), and thus they are not further detailed herein. In another embodiment, when the switch unit SWL includes a number of switches, in the condition that the switches SW1-SW3 conduct the first comparator input 122 and the pins S1-S3, respectively, and the switches in the switch unit SWL conduct the pins L1-L3, the touch pads TK1-TK9 can receive the driving signal L through the switch unit SWL. At the moment, if any one touch pad is accordingly operated (e.g., the touch pad TK3 is touched by a finger, a touch pen, etc., to have capacitance variations), the corresponding operations are similar to those mentioned above, and thus they are not further detailed herein.

As can be known from the embodiment illustrated in FIG. 5, the sensing device 500 can be coupled to multiple touch pads by a certain amount of pins and perform corresponding operations. For example in FIG. 5, the nine touch pads TK1-TK9 only require seven pins S1-S3, L1-L3 and DK. As a result, arrangements of pins in the sensing device can be decreased, to further save manufacturing cost.

Notably, the number of the aforementioned touch pads and pins are given for illustrative purposes but not limiting of the present disclosure, and thus, it is intended to cover various modifications and similar arrangements included within the spirit and scope of the appended claims, as is understood by one of ordinary skill in the art. For example, one of ordinary skill in the art may arrange a touch pad array having 4×4 touch pads and arrange 4+4+1=9 pins for the sensing device.

Furthermore, the controller 140 can further be configured to output the switch control signal SCS for controlling the switches SW1-SW3 and the switch unit SWL. In some embodiments, the controller 140 can be configured to output the switch control signal SCS for controlling the switches SW1-SW3 to be conducted, such that the sensing device 500 can rapidly sense the operations of the aforementioned touch pads, so as to perform corresponding functions or operations. In other embodiments, the controller 140 can be configured to output different switch control signals for controlling the switches SW1-SW3 and the switch unit SWL, respectively. Moreover, in various embodiments, in the condition that the switch unit SWL is replaced by several switches and these switches are separately coupled to the pins L1, L2 and L3, the controller 140 can be configured to output the switch control signals for controlling the switches SW1-SW3 and the switches in the switch unit SWL to be conducted, or in other embodiments, the controller 140 can be configured to output different switch control signals for controlling the switches SW1-SW3 and the switches (i.e., the switches in the switch unit SWL) coupled to the pins L1, L2 and L3. Thus, the present disclosure is not limited by the embodiment illustrated in FIG. 5.

In some embodiments, if the equivalent capacitance of the variable capacitor unit Cmn is not sufficient for performing effective potential compensation, the driving signal P1 can be set to have a higher voltage level, such that the variable capacitor unit Cmn is able to further provide a larger compensating potential according to the driving signal P1, for performing effective potential compensation.

Moreover, the controller 140 further can be configured to output the driving signal L1, and transmit the driving signal L through the switch unit SWL to the corresponding touch pads.

Figure 6:
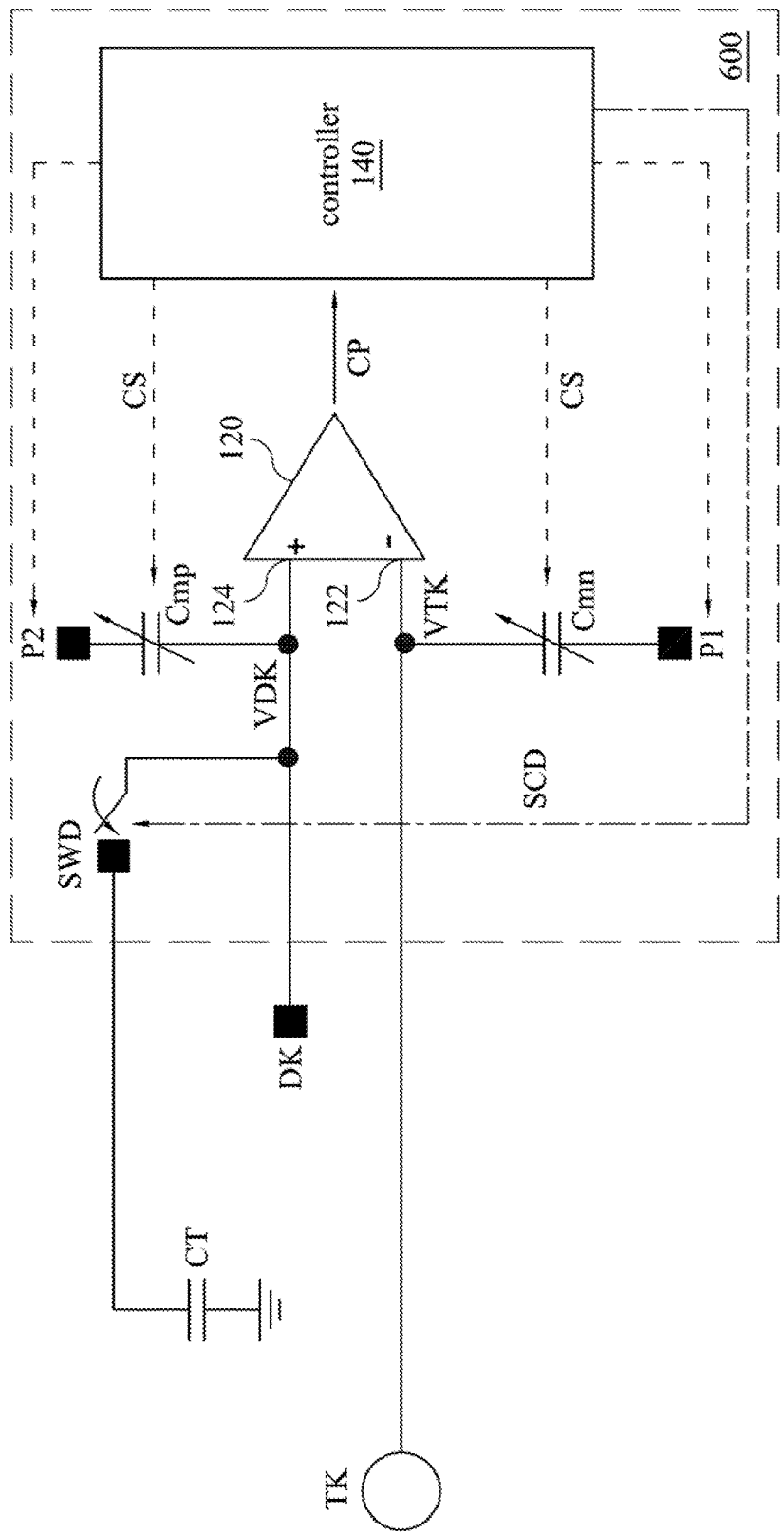
FIG. 6 is a schematic diagram of a sensing device according to a fourth embodiment of the present disclosure.

FIG. 6 is a schematic diagram of a sensing device according to a fourth embodiment of the present disclosure. Compared to the embodiment illustrated in FIG. 1, the sensing device 600 in the present embodiment further includes a switch SWD. The switch SWD is configured to be electrically coupled between the second comparator input 124 and an external capacitor CT, and selectively conduct the second comparator input 124 and the external capacitor CT. In practice, the external capacitor CT can have various configurations according to the self capacitance at the capacitive touch pad TK; for example, in the condition that the self capacitance at the capacitive touch pad TK is relatively larger, the external capacitor CT can have a relatively larger capacitance, and vice versa.

In operation, in the condition that the capacitive touch pad TK is operated (e.g., the capacitive touch pad TK is touched by a finger, a touch pen, etc., to have capacitance variations), the switch SWD can conduct the second comparator input 124 and the external capacitor CT according to a switch control signal SCD, such that the external capacitor CT is able to cooperate with the variable capacitor unit Cmp to perform potential compensation for the potential VDK of the second comparator input 124, and the potential VDK and the potential VTK are the same or close after compensation, in order for following touch sensing operations.

Moreover, for the sensing device 600 illustrated in FIG. 6, the driving signals P1 and P2 can be the same or different. In some embodiments, the voltage level of the driving signal P1 is higher than the voltage level of the driving signal P2. In further embodiments, the voltage level of the driving signal P1 can be approximately multiple times the voltage level of the driving signal P2. In other embodiments, at least one of the driving signals P1 and P2 is a pulse signal. In specific embodiments, each one of the driving signals P1 and P2 is a pulse signal.

Figure 7:
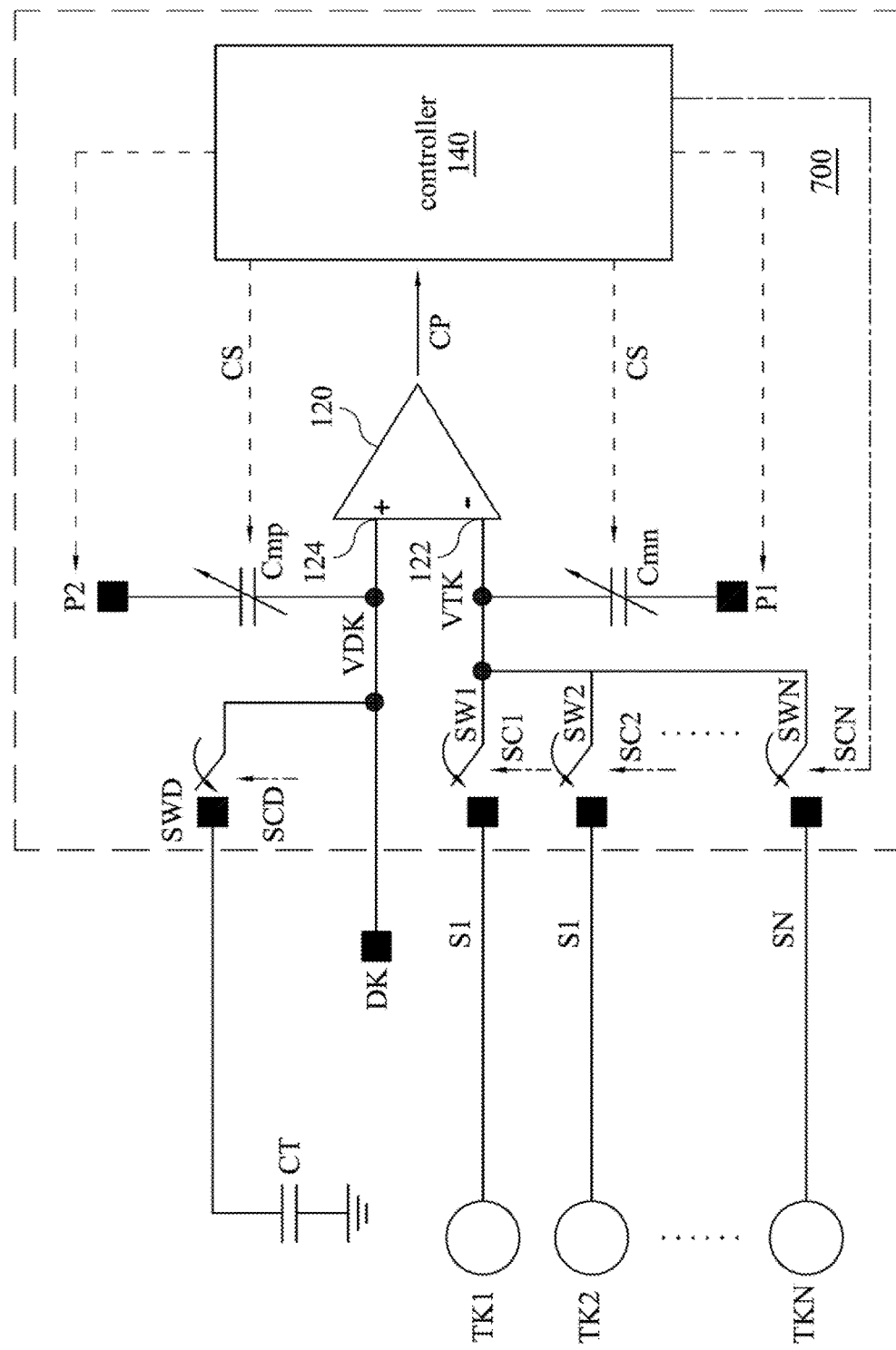
FIG. 7 is a schematic diagram of a sensing device according to a fifth embodiment of the present disclosure.

FIG. 7 is a schematic diagram of a sensing device according to a fifth embodiment of the present disclosure. The sensing device 700 illustrated in the present embodiment can be configured to sense several touch pads, which is similar to the embodiment illustrated in FIG. 4. Compared to FIG. 6, the sensing device 700 further can include switches SW1-SWN, in which the switches SW1-SWN are electrically coupled between the first comparator input 122 and the touch pads TK1-TKN, respectively, and can be configured to selectively conduct the first comparator input 122 and the touch pads TK1-TKN, respectively.

In operation, in the present embodiment, the operation of compensation for the potential VDK of the second comparator input 124 is similar to that illustrated in FIG. 6, and the operation of compensation for the potential VTK of the first comparator input 122 is similar to that illustrated in FIG. 4, and thus they are not further detailed herein.

On the other hand, in other embodiments, the sensing device 600 illustrated in FIG. 6 also can be arranged similar to the sensing device 500 illustrated in FIG. 5, including the switches SW1-SW3 and the switch unit SWL, and also including the switch SWD configured to selectively conduct the second comparator input 124 and the external capacitor CT. Specific operations are similar to those mentioned above, and thus they are not further detailed herein.

In practice, the sensing device in the aforementioned embodiments can be individually disposed or integrated into a signal processing circuit (e.g., an analog-to-digital converter circuit). The aforementioned driving signals can be various types of signals such as pulse signals, voltage signals, etc., and can be generated by a controller (e.g., a micro-controller, MCU) to be dynamically adjusted, in which the levels of the aforementioned driving signals also can be adjusted by a programmable device or an amplifying device, and thus they are not limited to those mentioned above.

Compared to conventional art, the sensing device in the exemplary embodiments of the present disclosure can perform very sensitive touch sensing operations by limited circuits (e.g., pins connected to capacitive touch pad) and limited capacitors, so as to have advantages in saving related circuits and capacitors and further reducing layout areas occupied by the circuits and capacitors, such that the size of the touch sensing device can be significantly reduced and manufacturing cost can be significantly decreased.

Moreover, in the condition that stray capacitance or self capacitance at the capacitive touch pad is relatively larger, very sensitive touch sensing operations also can be performed by limited circuits, such that manufacturing cost still can be significantly decreased.

As is understood by one of ordinary skill in the art, the foregoing embodiments of the present disclosure are illustrative of the present disclosure rather than limiting of the present disclosure. It is intended to cover various modifications and similar arrangements included within the spirit and scope of the appended claims, the scope of which should be accorded with the broadest interpretation so as to encompass all such modifications and similar structures.

What is claimed is:

1. A sensing device comprising:
   a comparator comprising a first comparator input and a second comparator input, the first comparator input configured to be electrically coupled to at least one first touch pad;
   a first variable capacitor unit electrically coupled to the first comparator input, the first variable capacitor unit configured to receive a first driving signal and charge the first comparator input according to the first driving signal, such that the first comparator input has a first potential;
   a second variable capacitor unit electrically coupled to the second comparator input, the second variable capacitor unit configured to receive a second driving signal and charge the second comparator input according to the second driving signal, such that the second comparator input has a second potential, wherein a voltage level of the first driving signal is higher than a voltage level of the second driving signal, and the comparator is configured to compare the first potential with the second potential to generate a comparator output signal; and
   a switch configured to be electrically coupled between the second comparator input and an external capacitor and configured to selectively conduct the second comparator input and the external capacitor to make the second variable capacitor and the external capacitor be connected in series, wherein a capacitance of the external capacitor is relevant to a self capacitance of the at least one first touch pad;
   wherein in a condition of the at least one first touch pad being operated to cause a potential of the first comparator input be lower than that of the second comparator input,
   the first variable capacitor unit is adjusted according to the comparator output signal to make the first variable capacitor unit have an equivalent capacitance larger than that of the second variable capacitor unit to perform potential compensation for the first comparator input, or the second variable capacitor unit is adjusted according to the comparator output signal to make the second variable capacitor unit have an equivalent capacitance less than that of the first variable capacitor unit to perform potential compensation for the second comparator input.

2. The sensing device as claimed in claim 1, wherein in the condition of the at least one first touch pad being operated, the first variable capacitor unit and the second variable capacitor unit are separately adjusted according to the comparator output signal to perform potential compensation for the first comparator input and the second comparator input.

3. The sensing device as claimed in claim 1, wherein the voltage level of the first driving signal is approximately multiple times the voltage level of the second driving signal.

4. The sensing device as claimed in claim 1, wherein at least one of the first driving signal and the second driving signal is a pulse signal.

5. The sensing device as claimed in claim 1, further comprising:
   a controller configured to receive the comparator output signal to generate the first driving signal and the second driving signal.

6. The sensing device as claimed in claim 5, wherein the controller is further configured to receive the comparator output signal to generate at least one control signal for controlling at least one of the first variable capacitor unit and the second variable capacitor unit, to selectively adjust equivalent capacitance of at least one of the first variable capacitor unit and the second variable capacitor unit.

7. The sensing device as claimed in claim 1, wherein the first comparator input is configured to be electrically coupled to a plurality of first touch pads, and the sensing device further comprises:
   a plurality of switches configured to be electrically coupled between the plurality of first touch pads and the first comparator input, and configured to selectively conduct the plurality of first touch pads and the first comparator input, respectively.

8. The sensing device as claimed in claim 7, further comprising:
   a controller configured to output a plurality of switch control signals to control the plurality of switches, respectively.

9. The sensing device as claimed in claim 1, wherein the first comparator input is configured to be electrically coupled to a plurality of series of touch pads, the plurality of series of touch pads comprise the at least one first touch pad, and the sensing device further comprises:

a plurality of first switches configured to selectively conduct the plurality of series of touch pads and the first comparator input, respectively;

a switch unit configured to switch on to pass a third driving signal to at least one touch pad of each series of touch pads of the plurality of series of touch pads; and a controller configured to output a plurality of switch control signals to control the plurality of first switches and the switch unit, and configured to output the first driving signal, the second driving signal, the third driving signal, or the combination thereof.

10. The sensing device as claimed in claim 9, wherein the switch unit comprises a plurality of switches.

11. A sensing device comprising:

a comparator comprising a first comparator input and a second comparator input, the first comparator input configured to be electrically coupled to at least one first touch pad;

a first variable capacitor unit electrically coupled to the first comparator input and configured to charge the first comparator input with a first driving signal, such that the first comparator input has a first potential;

a second variable capacitor unit electrically coupled to the second comparator input and configured to charge the second comparator input with a second driving signal, such that the second comparator input has a second potential, wherein the comparator is configured to compare the first potential with the second potential to generate a comparator output signal; and a first switch configured to be electrically coupled between the second comparator input and an external capacitor and configured to selectively conduct the second comparator input and the external capacitor to make the second variable capacitor and the external capacitor be connected in series, wherein a capacitance of the external capacitor is relevant to a self capacitance of the at least one first touch pad;

wherein in a condition of the at least one first touch pad being operated to cause a potential of the first comparator input be lower than that of the second comparator input, the first variable capacitor unit is adjusted according to the comparator output signal to make the first variable capacitor unit have an equivalent capacitance larger than that of the second variable capacitor unit to perform potential compensation for the first comparator input, or the second variable capacitor unit is adjusted according to the comparator output signal to make the second variable capacitor unit have an equivalent capacitance less than that of the first variable capacitor unit to perform potential compensation for the second comparator input.

12. The sensing device as claimed in claim 11, further comprising:

a controller configured to receive the comparator output signal to generate at least one control signal for controlling at least one of the first variable capacitor unit and the second variable capacitor unit, to selectively adjust equivalent capacitance of at least one of the first variable capacitor unit and the second variable capacitor unit.

13. The sensing device as claimed in claim 11, wherein the first comparator input is configured to be electrically coupled to a plurality of first touch pads, and the sensing device further comprises:

a plurality of second switches configured to electrically coupled between the plurality of first touch pads and the first comparator input, and configured to selectively conduct the plurality of first touch pads and the first comparator input, respectively.

14. The sensing device as claimed in claim 13, further comprising:

a controller configured to output a plurality of switch control signals for controlling the first switch and the plurality of second switches, respectively.

15. The sensing device as claimed in claim 11, wherein the first comparator input is configured to be electrically coupled to a plurality of series of touch pads, the plurality of series of touch pads comprise the at least one first touch pad, and the sensing device further comprises:

a plurality of second switches configured to selectively conduct the plurality of series of touch pads and the first comparator input, respectively;

a switch unit configured to switch on to pass a third driving signal to at least one touch pad of each series of touch pads of the plurality of series of touch pads; and a controller configured to output a plurality of switch control signals for controlling the plurality of second switches and the switch unit, and configured to output the first driving signal, the second driving signal, the third driving signal, or the combination thereof.

\* \* \* \* \*